(12) United States Patent
He et al.

(10) Patent No.: US 9,068,278 B2
(45) Date of Patent: Jun. 30, 2015

(54) MULTIPLE STACK DEPOSITION FOR EPITAXIAL LIFT OFF

(75) Inventors: Gang He, Sunnyvale, CA (US); Andreas Hegedus, Burlingame, CA (US)

(73) Assignee: Alta Devices, Inc., Santa Clara, CA (US)

( * ) Notice: Subject to any disclaimer, the term of this patent is extended or adjusted under 35 U.S.C. 154(b) by 1019 days.

(21) Appl. No.: 12/632,565

(22) Filed: Dec. 7, 2009

(65) Prior Publication Data
US 2010/0147370 A1     Jun. 17, 2010

Related U.S. Application Data

(60) Provisional application No. 61/120,687, filed on Dec. 8, 2008.

(51) Int. Cl.
| | |
|---|---|
| C30B 21/02 | (2006.01) |
| C30B 29/42 | (2006.01) |
| C30B 29/40 | (2006.01) |
| C30B 33/06 | (2006.01) |
| H01L 31/0304 | (2006.01) |
| H01L 31/0725 | (2012.01) |
| H01L 31/0735 | (2012.01) |

(Continued)

(52) U.S. Cl.
CPC ............ *C30B 29/42* (2013.01); *C30B 29/40* (2013.01); *C30B 33/06* (2013.01); *H01L 31/0304* (2013.01); *H01L 31/03046* (2013.01); *H01L 31/0725* (2013.01); *H01L 31/0735* (2013.01); *H01L 31/184* (2013.01); *H01L 31/1844* (2013.01); *H01L 21/02463* (2013.01); *H01L 21/02546* (2013.01); *Y02E 10/544* (2013.01)

(58) Field of Classification Search
USPC ................................ 117/86, 90, 101, 104, 915
See application file for complete search history.

(56) References Cited

U.S. PATENT DOCUMENTS

| | | |
|---|---|---|
| 3,993,533 A | 11/1976 | Milnes et al. |
| 4,445,965 A | 5/1984 | Milnes |
| 4,727,047 A | 2/1988 | Bozler et al. |

(Continued)

FOREIGN PATENT DOCUMENTS

WO    WO-2006131316 A1    12/2006

OTHER PUBLICATIONS

Bauhuis, G.J., "Substrate Reuse for Epitaxial Lift-Off of III-V Solar Cells", Proceedings of the 22nd European Photovoltaic Solar Energy Conference: Milan, Sep. 3-7, 2007, pp. 106-110.

(Continued)

*Primary Examiner* — Bob M Kunemund

(57) ABSTRACT

Embodiments of the invention are provided for a thin film stack containing a plurality of epitaxial stacks disposed on a substrate and a method for forming such a thin film stack. In one embodiment, the epitaxial stack contains a first sacrificial layer disposed over the substrate, a first epitaxial film disposed over the first sacrificial layer, a second sacrificial layer disposed over the first epitaxial film, and a second epitaxial film disposed over the second sacrificial layer. The thin film stack may further contain additional epitaxial films disposed over sacrificial layers. Generally, the epitaxial films contain gallium arsenide alloys and the sacrificial layers contain aluminum arsenide alloys. Methods provide the removal of the epitaxial films from the substrate by etching away the sacrificial layers during an epitaxial lift off (ELO) process. The epitaxial films are useful as photovoltaic cells, laser diodes, or other devices or materials.

47 Claims, 7 Drawing Sheets

(51) Int. Cl.
*H01L 31/18* (2006.01)
*H01L 21/02* (2006.01)

(56) References Cited

U.S. PATENT DOCUMENTS

| | | | |
|---|---|---|---|
| 4,846,931 | A | 7/1989 | Gmitter et al. |
| 4,883,561 | A | 11/1989 | Gmitter et al. |
| 5,073,230 | A | 12/1991 | Maracas et al. |
| 5,122,852 | A | 6/1992 | Chang et al. |
| 5,201,996 | A | 4/1993 | Gmitter et al. |
| 5,221,637 | A | 6/1993 | De Boeck |
| 5,256,562 | A | 10/1993 | Vu et al. |
| 5,258,325 | A | 11/1993 | Spitzer et al. |
| 5,276,345 | A | 1/1994 | Siegel et al. |
| 5,277,749 | A | 1/1994 | Griffith et al. |
| 5,286,335 | A | 2/1994 | Drabik et al. |
| 5,344,517 | A | 9/1994 | Houlding |
| 5,362,683 | A * | 11/1994 | Takenaka et al. ............ 438/458 |
| 5,366,555 | A | 11/1994 | Kelly |
| 5,401,983 | A | 3/1995 | Jokerst et al. |
| 5,458,694 | A | 10/1995 | Nuyen |
| 5,465,009 | A | 11/1995 | Drabik et al. |
| 5,476,810 | A | 12/1995 | Curran |
| 5,479,043 | A | 12/1995 | Nuyen |
| 5,528,719 | A | 6/1996 | Yamada |
| 5,546,375 | A | 8/1996 | Shimada et al. |
| 5,641,381 | A | 6/1997 | Bailey et al. |
| 5,827,751 | A | 10/1998 | Nuyen |
| 5,985,742 | A | 11/1999 | Henley et al. |
| 6,010,579 | A | 1/2000 | Henley et al. |
| 6,071,795 | A | 6/2000 | Cheung et al. |
| 6,155,909 | A | 12/2000 | Henley et al. |
| 6,214,733 | B1 | 4/2001 | Sickmiller |
| 6,221,740 | B1 | 4/2001 | Bryan et al. |
| 6,222,210 | B1 | 4/2001 | Cerny et al. |
| 6,232,136 | B1 | 5/2001 | Zavracky et al. |
| 6,263,941 | B1 | 7/2001 | Bryan et al. |
| 6,284,631 | B1 | 9/2001 | Henley et al. |
| 6,287,891 | B1 | 9/2001 | Sayyah |
| 6,290,804 | B1 | 9/2001 | Henley et al. |
| 6,291,313 | B1 | 9/2001 | Henley et al. |
| 6,294,814 | B1 | 9/2001 | Henley et al. |
| 6,346,459 | B1 | 2/2002 | Usenko et al. |
| 6,352,909 | B1 | 3/2002 | Usenko |
| 6,387,829 | B1 | 5/2002 | Usenko et al. |
| 6,391,740 | B1 | 5/2002 | Cheung et al. |
| 6,414,783 | B2 | 7/2002 | Zavracky et al. |
| 6,458,672 | B1 | 10/2002 | Henley et al. |
| 6,486,041 | B2 | 11/2002 | Henley et al. |
| 6,500,732 | B1 | 12/2002 | Henley et al. |
| 6,504,524 | B1 | 1/2003 | Gates et al. |
| 6,511,899 | B1 | 1/2003 | Henley et al. |
| 6,513,564 | B2 | 2/2003 | Bryan et al. |
| 6,528,391 | B1 | 3/2003 | Henley et al. |
| 6,548,382 | B1 | 4/2003 | Henley et al. |
| 6,554,046 | B1 | 4/2003 | Bryan et al. |
| 6,559,075 | B1 | 5/2003 | Kelly et al. |
| 6,589,811 | B2 | 7/2003 | Sayyah |
| 6,632,724 | B2 | 10/2003 | Henley et al. |
| 6,669,801 | B2 | 12/2003 | Yoshimura et al. |
| 6,677,249 | B2 | 1/2004 | Laermer et al. |
| 6,740,604 | B2 | 5/2004 | Kelly et al. |
| 6,790,747 | B2 | 9/2004 | Henley et al. |
| 6,809,044 | B1 | 10/2004 | Aspar et al. |
| 6,890,838 | B2 | 5/2005 | Henley et al. |
| 6,943,050 | B2 | 9/2005 | Kondo |
| 6,974,521 | B2 | 12/2005 | Schermer |
| 7,045,878 | B2 | 5/2006 | Faris |
| 7,056,808 | B2 | 6/2006 | Henley et al. |
| 7,060,591 | B2 | 6/2006 | Yamazaki et al. |
| 7,153,761 | B1 | 12/2006 | Nastasi et al. |
| 7,160,790 | B2 | 1/2007 | Henley et al. |
| 7,163,826 | B2 | 1/2007 | Faris |
| 7,198,671 | B2 | 4/2007 | Ueda |
| 7,202,141 | B2 | 4/2007 | Park et al. |
| 7,229,901 | B2 | 6/2007 | Savage et al. |
| 7,241,667 | B2 | 7/2007 | Park et al. |
| 7,341,925 | B2 | 3/2008 | Kelly et al. |
| 7,348,258 | B2 | 3/2008 | Henley et al. |
| 7,638,410 | B2 | 12/2009 | Nastasi et al. |
| 2008/0299746 | A1 | 12/2008 | Yao et al. |
| 2009/0321881 | A1 | 12/2009 | Archer et al. |
| 2009/0321885 | A1 | 12/2009 | Archer et al. |
| 2009/0321886 | A1 | 12/2009 | Gmitter et al. |
| 2009/0324379 | A1 | 12/2009 | He et al. |
| 2009/0325367 | A1 | 12/2009 | He et al. |
| 2010/0001316 | A1 | 1/2010 | Gmitter et al. |
| 2010/0001374 | A1 | 1/2010 | Gmitter et al. |

OTHER PUBLICATIONS

Bauhuis, G.J., "Thin film GaAs solar cells with increased quantum efficiency due to light reflection", Solar Energy Materials & Solar Cells 83 (2004) 81-90, Nov. 3, 2003.

Konagai, Makoto, "High Efficiency GaAs Thin Film Solar Cells by Peeled Film Technology", Journal of Crystal Growth 45 (1978) 277-280.

Kumar, P., "Sacrificial etching of $Al_xGa_{1-x}As$ for III-V MEMS surface micromachining", Appl. Phys. A 88, 711-714, May 24, 2007.

Schermer J.J., "Epitaxial Lift-Off for large area thin film III/V devices", Phys. Stat. Sol. (1) 202, No. 4, 501-508 (2005).

Schermer, J.J., "Photon confinement in high-efficiency, thin-film III-V solar cells obtained by epitaxial lift-off", Thin Solid Films 511-512 (2006) 645-653, Jan. 19, 2006.

Schermer, J.J., "Thin-film GaAs Epitaxial Lift-Off Solar Cells for Space Applications", Prog. Photovolt: Res. Appl. 2005; 13:587-596, Apr. 28, 2005.

Schermer, John, "Solar Cells Based on III-V Semiconductors", Joint Solar Panel, Sep. 29, 2004.

Sickmiller, Mike, "Packaging of Ultrathin Semiconductor Devices Through the ELO Packaging Process", Mat. Res. Soc. Symp. Proc. vol. 681E (2001).

van Deelen, J. "On the development of high-efficiency thin-film GaAs and GaInP2 cells", Journal of Cyrstal Growth 298 (2007) 772-776, Nov. 28, 2006.

van Niftrik, A. T. J., "HF Species and Dissolved Oxygen on the Epitaxial Lift-Off Process of GaAs Using AlAsP Release Layers", Journal of The Electrochemical Society, 155 (1) D35-D39 (2008), Nov. 6, 2007.

van Niftrik, A.T.J., "A Diffusion and Reaction Related Model of the Epitaxial Lift-Off Process", Journal of the Electrochemical Society, 154 (11) D629-D635 (2007), Sep. 19, 2007.

van Niftrik, Antonius T. J., "The Influence of $In_xGa_{1-x}As$ and $GaAs_{1-y}P_y$ Layers Surrounding the AlAs Release Layer in the Epitaxial Lift-Off Process", Crystal Growth & Design, 2007, vol. 7, No. 12, 2472-2480, Aug. 7, 2007.

Voncken, M.M.A.J., "Strain-accelerated HF etching of AlAs for epitaxial lift-off", J. Phys.: Condens. Matter 16 (2004) 3585-3596, May 14, 2004.

Voncken, M.M.A.J., "Influence of radius of curvature on the lateral etch rate of the weight induced epitaxial lift-off process", Material Science and Engineering B95 (2002) 242-248, May 21, 2002.

Voncken, M.M.A.J., "Multiple release layer study of the intrinsic lateral etch rate of the epitaxial lift-off process", Appl. Phys. A 79, 1801-1807, Mar. 28, 2003.

Yablonovitch, E., "Van De Weals bonding of GaAs epitaxial liftoff films onto arbitrary substrates", Appl. Phys. Lett. 56 (24), Jun. 11, 1990.

Niccio C, et al.: "Enhancing Semiconductor Reactions", IBM Technical Disclosure Bulletin, vol. 12, No. 9, Feb. 1, 1970, pp. 1433-1433, XP001298611.

* cited by examiner

US 9,068,278 B2

MULTIPLE STACK DEPOSITION FOR EPITAXIAL LIFT OFF

CROSS-REFERENCE TO RELATED APPLICATION

This application claims benefit of U.S. Ser. No. 61/120,687, filed Dec. 8, 2008, which is hereby incorporated by reference in its entirety.

BACKGROUND OF THE INVENTION

1. Field of the Invention

Embodiments of the invention generally relate to electronic device fabrication, such as for photovoltaic or semiconductor devices, and more particularly to thin films and the methods for forming such films, such as by epitaxial lift off (ELO) techniques.

2. Description of the Related Art

A critical phase of electronic device fabrication involves handling and packaging of thin films which are used in the solar and semiconductor industries. These devices may be manufactured by depositing an epitaxial layer on a sacrificial layer on a growth substrate, then etching the sacrificial layer to separate the epitaxial layer from the growth substrate. This technique is known as epitaxial lift off (ELO) and the thin epitaxial layer is known as an ELO thin film. These thin films are typically used as a photovoltaic cell, a laser diode, a semiconductor device, or another type of electronic device. The thin epitaxial film is very difficult to handle, bond to a substrate, and to package since each film is very fragile (e.g., crack under very small forces) and has extremely narrow dimensions (e.g., difficult to align).

Also, the ELO process has always been a cost prohibiting technique for commercially producing the thin film devices. Current ELO processes include transferring a single growth substrate through many fabrication steps while producing a single thin film. The current processes are time consuming, costly, and rarely produce commercial quality thin films.

Therefore, there is a need for more robust ELO thin film materials and methods for forming such materials wherein the methods are less time consuming and less expensive than known processes.

SUMMARY OF THE INVENTION

Embodiments of the invention are provided for a thin film stack containing a plurality of epitaxial stacks disposed on a substrate and a method for forming the thin film stack. Each epitaxial stack contains at least an epitaxial film disposed over a sacrificial layer. The epitaxial films are separated and removed from the substrate by etching away the sacrificial layers during an epitaxial lift off (ELO) process. The epitaxial films are ELO thin film materials and devices useful in the manufacturing of photovoltaic cells, laser diodes, semiconductor devices, or other electronic devices or materials.

In one embodiment, a thin film stack disposed on a substrate surface is provided which includes a plurality of epitaxial stacks disposed on a substrate (e.g., gallium arsenide substrate), wherein each epitaxial stack contains an epitaxial film disposed over a sacrificial layer. In the examples, the plurality of epitaxial stacks may contain 2 or more epitaxial stacks, such as 3, 4, 5, 6, 10, 12, 20, 30, 50, 100, or more epitaxial stacks. Each of the epitaxial films within a plurality of epitaxial stacks may have the same composition or have different compositions. Also, each of the sacrificial layers within a plurality of epitaxial stacks may have the same composition or have different compositions.

In some embodiments, the epitaxial stack disposed on a substrate surface is provided which contains a first sacrificial layer disposed over the substrate, a first epitaxial film disposed over the first sacrificial layer, a second sacrificial layer disposed over the first epitaxial film, and a second epitaxial film disposed over the second sacrificial layer. The epitaxial stack may further contain a third sacrificial layer disposed over the second epitaxial film and a third epitaxial film disposed over the third sacrificial layer. In other embodiments, the epitaxial stack may further contain additional pairs of epitaxial films disposed over sacrificial layers, where each pair is disposed over the last previously deposited epitaxial film.

In specific one example, the epitaxial stack disposed on a substrate surface contains a first sacrificial layer disposed over a substrate containing gallium arsenide, a first epitaxial film disposed over the first sacrificial layer, a second sacrificial layer disposed over the first epitaxial film, a second epitaxial film disposed over the second sacrificial layer, a third sacrificial layer disposed over the second epitaxial film, and a third epitaxial film disposed over the third sacrificial layer, wherein each of the first, second, and third epitaxial films independently contains gallium arsenide or a gallium arsenide alloy, and each of the first, second, third, and any additional sacrificial layers independently contains aluminum arsenide or an aluminum arsenide alloy.

In another embodiment, a method for forming epitaxial stacks on a substrate surface is provided which includes depositing a first sacrificial layer over a substrate, depositing a first epitaxial film over the first sacrificial layer, depositing a second sacrificial layer over the first epitaxial film, depositing a second epitaxial film over the second sacrificial layer, and separating the first and second epitaxial films from the substrate during an ELO process.

In some examples, the method provides forming a third sacrificial layer over the second epitaxial film within the first deposition region of the processing chamber and forming a third epitaxial film over the third sacrificial layer within the second deposition region of the processing chamber prior to the ELO process.

The ELO process may include etching away the second sacrificial layer while removing the second epitaxial film and etching away the first sacrificial layer while removing the first epitaxial film. In some embodiments, the method provides that the first, second, and any additional epitaxial films are simultaneously separated from the substrate. In other embodiments, the method provides etching sacrificial layers in a descending order from furthest from the substrate to closest to the substrate, so that the epitaxial films are removed in the same order. For example, the etching away the first sacrificial layer while removing the first epitaxial film is subsequent to etching away the second sacrificial layer while removing the second epitaxial film. Also, the etching away the second sacrificial layer while removing the second epitaxial film is subsequent to etching away the third sacrificial layer while removing the third epitaxial film.

In some embodiments, a method for forming epitaxial film stacks on a substrate surface is provided which includes forming a first sacrificial layer on a substrate within a first deposition region of a processing chamber, forming a first epitaxial film over the first sacrificial layer within a second deposition region of the processing chamber, forming a second sacrificial layer over the first epitaxial film within the first deposition region of the processing chamber, forming a second epitaxial film over the second sacrificial layer within the second deposition region of the processing chamber, and separating the first and second epitaxial films from the substrate during an ELO process. The ELO process provides etching away the second sacrificial layer while removing the second epitaxial film and etching away the first sacrificial layer while removing the first epitaxial film. In many examples, the method further provides forming a third sacrificial layer over the second epitaxial film within the first deposition region of the processing chamber, and forming a third epitaxial film over the third sacrificial layer within the second deposition region of the processing chamber prior to the at least one ELO process.

In another embodiment, a method for forming epitaxial film stacks on a substrate surface within a processing chamber is provided which includes forming a first epitaxial stack on a substrate by depositing a first sacrificial layer over the substrate and depositing a first epitaxial film over the first sacrificial layer, forming additional epitaxial stacks on the substrate and over the first epitaxial stack, wherein each additional epitaxial stack contains an epitaxial film deposited over a sacrificial layer and each sacrificial layer is deposited on the epitaxial film of the previously deposited epitaxial stack. The method further provides etching the sacrificial layers while removing the epitaxial films from the substrate during an ELO process.

In some embodiments, the substrate may be disposed on a rotatable platen or carousal or a rotatable drum within a processing chamber. A plurality of substrates may be disposed on the rotatable platen or the rotatable drum within the processing chamber while a plurality of sacrificial layers and epitaxial films are deposited on each of the substrates. In some embodiments, the substrate may be positioned under a first showerhead to deposit sacrificial layers and the substrate is subsequently rotated and positioned under a second showerhead to deposit an epitaxial film over each of the sacrificial layers. The multiple layers of each epitaxial film may be deposited from a different region of the processing chamber or from a different showerhead within the processing chamber.

Each epitaxial film may have the same composition or have different compositions. In some examples, each epitaxial film may independently contain gallium arsenide, aluminum gallium arsenide, indium gallium phosphide, alloys thereof, derivatives thereof, or combinations thereof. Also, each epitaxial film may have multiple layers. In one example, each epitaxial film independently has a layer containing gallium arsenide and another layer containing aluminum gallium arsenide. In many examples, the epitaxial film may have a thickness within a range from about 500 nm to about 3,000 nm, or from about 1,000 nm to about 2,000 nm, or from about 1,200 nm to about 1,800 nm.

In other examples, each epitaxial film may independently contain a buffer layer, a passivation layer, and a gallium arsenide active layer. In some examples, each epitaxial film further contains a second passivation layer. In one example, each epitaxial film may independently have a buffer layer containing gallium arsenide, two passivation layers containing aluminum gallium arsenide, and a gallium arsenide active layer. The gallium arsenide buffer layer may have a thickness within a range from about 100 nm to about 400 nm, each of the aluminum gallium arsenide passivation layers may independently have a thickness within a range from about 10 nm to about 50 nm, and the gallium arsenide active layer may have a thickness within a range from about 400 nm to about 2,000 nm. In other examples, the gallium arsenide buffer layer may have a thickness of about 300 nm, each of the aluminum gallium arsenide passivation layers may have a thickness of about 30 nm, and the gallium arsenide active layer may have a thickness of about 1,000 nm.

In some examples, each of the epitaxial films has a solar or photovoltaic cell structure containing multiple layers. In one example, the solar or photovoltaic cell structure contains a material such as gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

In another embodiment, each of the sacrificial layers contains a selective etch material which is readily etched by an etchant (e.g., HF) that does not etch or substantially etch the materials of the epitaxial films. Exemplary selective etch materials contained within the sacrificial layers include aluminum arsenide, alloys thereof, derivatives thereof, or combinations thereof. In some examples, each of the sacrificial layers may independently contain an aluminum arsenide layer. Each sacrificial layer may have a thickness of about 20 nm or less, such as within a range from about 1 nm to about 10 nm, or from about 4 nm to about 6 nm. In many examples, the substrate or wafer contains gallium arsenide, gallium arsenide alloys, n-doped gallium arsenide, p-doped gallium arsenide, or derivatives thereof.

In some embodiments, the sacrificial layers may be exposed to a wet etch solution during an etch step within the ELO process. The wet etch solution may contain hydrofluoric acid, and further contain a surfactant and/or a buffer. In some example, the sacrificial layers or materials may be etched during a wet etch process at a rate of about 0.3 mm/hr or greater, preferably, about 1 mm/hr or greater, and more preferably, about 5 mm/hr or greater.

In an alternative embodiment, the sacrificial layers may be exposed to an electrochemical etch during the etch step within the ELO process. The electrochemical etch may include a biased process or a galvanic process. In another embodiment, the sacrificial layers or materials may be exposed to a vapor phase etch during an ELO etch step. The vapor phase etch includes exposing the sacrificial layers or materials to hydrogen fluoride vapor. The ELO process as described herein may contain an etching process or an etching step such as a photochemical etch process, a thermally enhanced etch process, a plasma enhanced etch process, a stress enhanced etch process, derivatives thereof, or combinations thereof.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
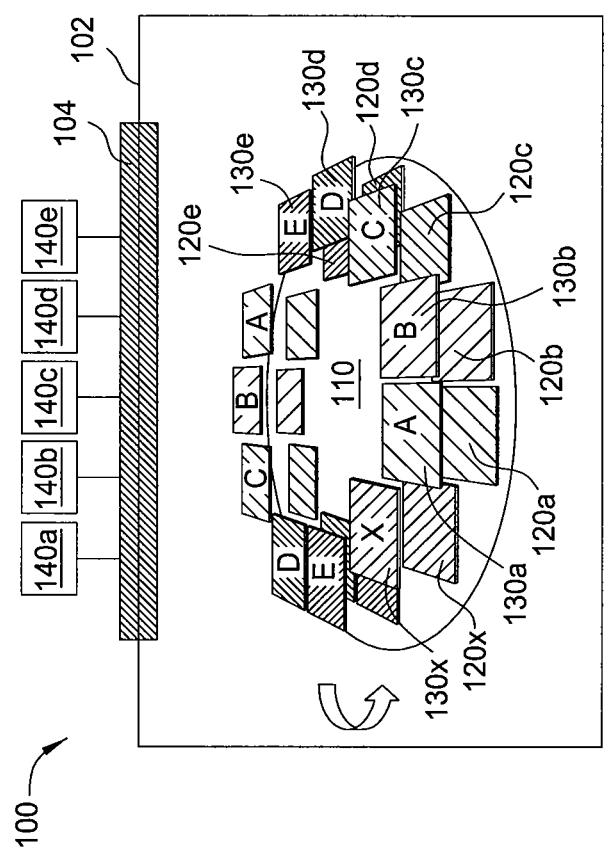
FIG. 1 depicts a vapor deposition system containing substrates on a rotatable platen or carousal according to embodiments described herein.

FIG. 1 depicts a vapor deposition system 100 containing substrates or wafers 120a-120e on a carousal or a rotatable platen 110 within a processing chamber 102, as described in one embodiment herein. Vapor deposition system 100 further contains a plurality of showerheads 130a-130e which are in fluid communication and coupled with a plurality of reagent sources 140a-140e via mass flow controller (MFC) 104. Conduits may extend between showerheads 130a-130e and MFC 104 as well as between reagent sources 140a-140e and MFC 104.

Each reagent source 140 contains a source of a chemical reagent or multiple sources of chemical reagents. Rotatable platen 110 may be rotated or turned to position each wafer 120 under an individual showerhead 130 while the plurality of showerheads 130a-130e remains stationary. Generally, substrates or wafers 120 are made from or contain gallium arsenide, gallium arsenide alloys, n-doped gallium arsenide, p-doped gallium arsenide, or derivatives thereof.

FIG. 1 depicts two pluralities of wafers 120a-120e which are individually positioned under two pluralities of showerheads 130a-130e and exposed to chemical reagents from reagent sources 140a-140e. Rotatable platen 110 may be turned so that each of wafers 120a-120e is positioned under each of showerheads 130a-130e and sequential exposed to a respective chemical reagent coming from reagent sources 140a-140e during each CVD process step. Wafer 120x may be a new wafer introduced at the entrance into vapor deposition system 100 or a processed wafer containing epitaxial stacks ready for removal at the exit of vapor deposition system 100. In one example, wafer 100x is a new wafer and may be exposed to a pretreatment process via showerhead 130x prior to being rotated under showerhead 130a.

Each showerhead 130 is individually in fluid communication and coupled with a respective reagent source 140. Therefore, as depicted in FIG. 1, showerheads 130a are in fluid communication and coupled with reagent source 140a and wafers 120a are positioned underneath showerheads 130a for being exposed to a chemical reagent transferred from reagent source 140a; showerheads 130b are in fluid communication and coupled with reagent source 140b and wafers 120b are positioned underneath showerheads 130b for being exposed to a chemical reagent transferred from reagent source 140b; showerheads 130c are in fluid communication and coupled with reagent source 140c and wafers 120c are positioned underneath showerheads 130c for being exposed to a chemical reagent transferred from reagent source 140c; showerheads 130d are in fluid communication and coupled with reagent source 140d and wafers 120d are positioned underneath showerheads 130d for being exposed to a chemical reagent transferred from reagent source 140d; and showerheads 130e are in fluid communication and coupled with reagent source 140e and wafers 120e are positioned underneath showerheads 130e for being exposed to a chemical reagent transferred from reagent source 140e.

In one embodiment, vapor deposition system 100, as depicted in FIG. 1, is configured to deposit two epitaxial stacks on each of the wafers 120a-120e. However, a larger diameter rotatable platen 110 may be used to provide additional epitaxial stacks. In some examples, each layer of the epitaxial stacks may independently contain gallium arsenide, aluminum gallium arsenide, indium gallium phosphide, alloys thereof, derivatives thereof, or combinations thereof.

A first epitaxial stack may be formed on each of the wafers 120a-120e on the first half of the rotatable platen 110 within vapor deposition system 100. In one example, showerhead 130a is configured to flow chemical reagents (e.g., aluminum and arsenic precursors) while depositing a sacrificial layer (e.g., aluminum arsenide) on wafer 120a, showerhead 130b is configured to flow chemical reagents (e.g., gallium and arsenic precursors) while depositing a buffer layer (e.g., gallium arsenide) over the sacrificial layer on wafer 120b, showerhead 130c is configured to flow chemical reagents (e.g., aluminum, gallium, and arsenic precursors) while depositing a passivation layer (e.g., aluminum gallium arsenide) over the buffer layer on wafer 120c, showerhead 130d is configured to flow chemical reagents (e.g., gallium and arsenic precursors) while depositing an active layer (e.g., gallium arsenide) over the passivation layer on wafer 120d, and showerhead 130e is configured to flow chemical reagents (e.g., aluminum, gallium, and arsenic precursors) while depositing a second passivation layer (e.g., aluminum gallium arsenide) over the active layer on wafer 120e. A second epitaxial stack may be formed on the first epitaxial stacks disposed on each of the wafers 120a-120e by repeating the above deposition sequence on the second half of the rotatable platen 110 within vapor deposition system 100.

Figure 2:
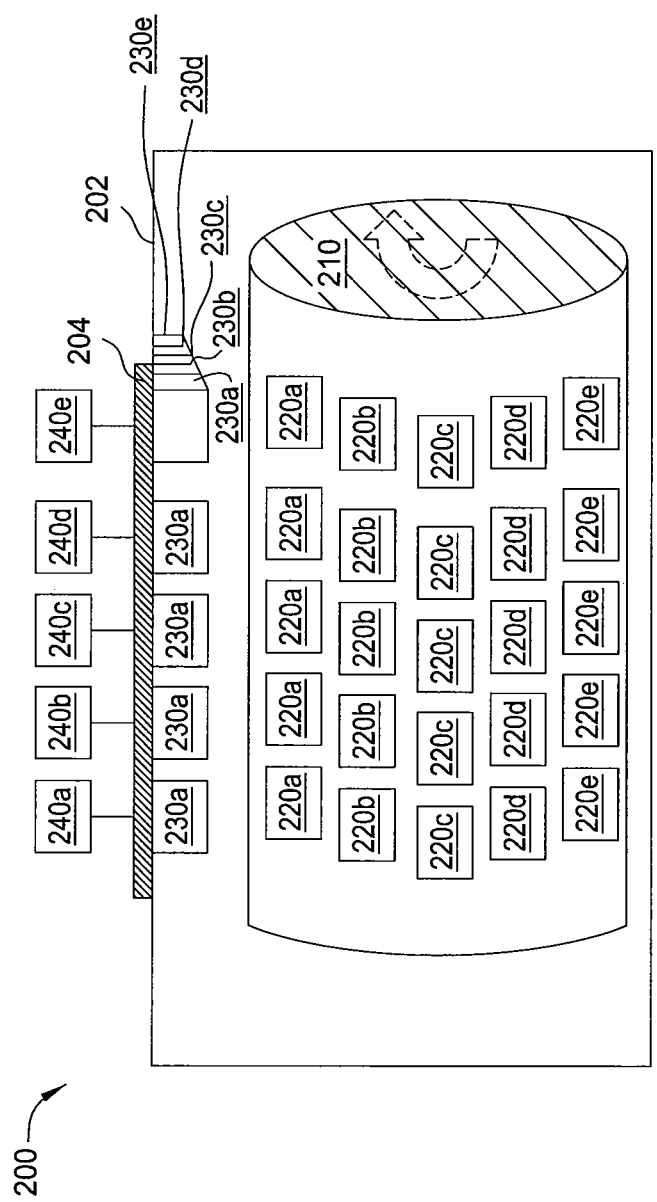
FIG. 2 depicts another vapor deposition system containing substrates on a rotatable drum according to other embodiments described herein.

FIG. 2 depicts a vapor deposition system 200 containing substrates or wafers 120a-120e on a rotatable drum 210 within a processing chamber 202, as described in another embodiment herein. Vapor deposition system 200 further contains showerheads 230a-230e which are in fluid communication and coupled with reagent sources 240a-240e via mass flow controller (MFC) 204. Conduits may extend between showerheads 230a-230e and MFC 204 as well as between the reagent sources 240 and MFC 204. Each of the showerheads 230a-230e is individually in fluid communication and coupled with a particular reagent source 240. Each reagent source 240 may contain one source of a chemical reagent or multiple sources of chemical reagents. Rotatable drum 210 may be rotated or turned to position each of the wafers 120a-120e under an individual showerhead 230 while the plurality of showerheads 230 remains stationary.

FIG. 2 depicts five pluralities of wafers 220a-220e which are individually positioned under five pluralities of showerheads 230a-230e and exposed to chemical reagents from reagent sources 240a-240e. Rotatable drum 210 may be turned so that every wafer is positioned under every showerhead and sequential exposed to the reagents of each CVD process at each showerhead.

In one embodiment, vapor deposition system 200, as depicted in FIG. 2, is configured to deposit two epitaxial stacks on a wafer. However, a larger diameter rotatable drum 210 may be used to provide additional epitaxial stacks. In some examples, each layer of the epitaxial stacks may independently contain gallium arsenide, aluminum gallium arsenide, indium gallium phosphide, alloys thereof, derivatives thereof, or combinations thereof.

In one example, the first epitaxial stack may be formed on the wafers on the first half of the rotatable drum 210 within vapor deposition system 200 wherein showerhead 230a is configured to flow chemical reagents (e.g., aluminum and arsenic precursors) while depositing a sacrificial layer (e.g., aluminum arsenide) on wafer 220a, showerhead 230b is configured to flow chemical reagents (e.g., gallium and arsenic precursors) while depositing a buffer layer (e.g., gallium arsenide) over the sacrificial layer on wafer 220b, showerhead 230c is configured to flow chemical reagents (e.g., aluminum, gallium, and arsenic precursors) while depositing a passivation layer (e.g., aluminum gallium arsenide) over the buffer layer on wafer 220c, showerhead 230d is configured to flow chemical reagents (e.g., gallium and arsenic precursors) while depositing an active layer (e.g., gallium arsenide) over the passivation layer on wafer 220d, and showerhead 230e is configured to flow chemical reagents (e.g., aluminum, gallium, and arsenic precursors) while depositing a second passivation layer (e.g., aluminum gallium arsenide) over the active layer on wafer 220e. A second epitaxial stack may be formed on the first epitaxial stacks disposed on the wafers by repeating the above deposition sequence on the second half of the rotatable drum 210 (unseen side in FIG. 2)) within vapor deposition system 200.

Figure 3:
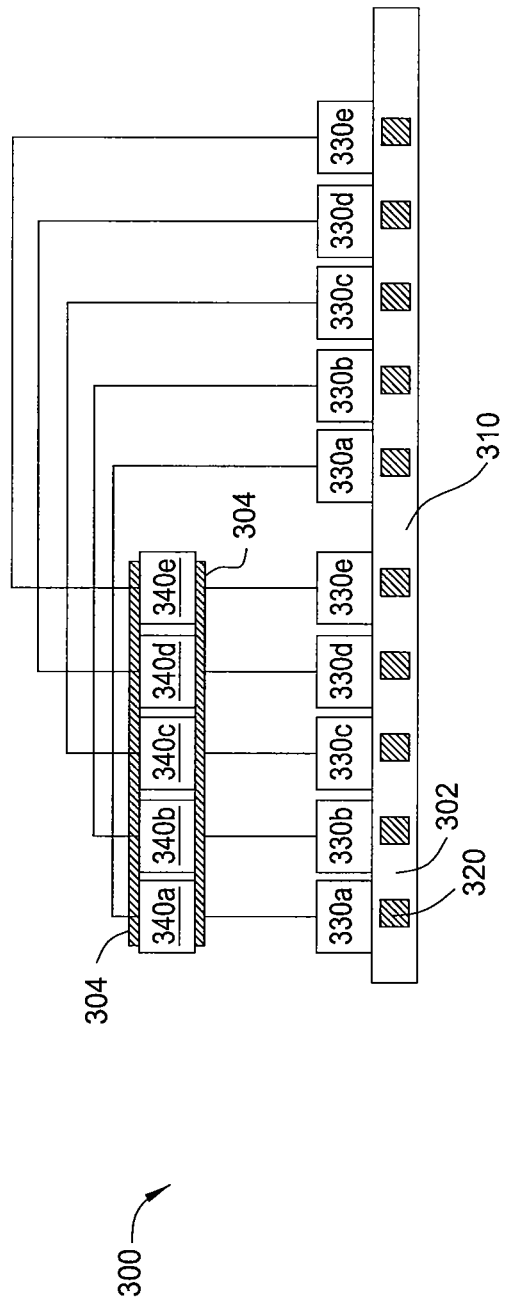
FIG. 3 depicts another vapor deposition system containing substrates on a track according to other embodiments described herein.

FIG. 3 depicts a vapor deposition system 300 containing substrates or wafers 320 on track 310 within a processing chamber 302, as described in another embodiment herein. Vapor deposition system 300 further contains showerheads 330a-330e which are in fluid communication and coupled with reagent sources 340a-340e via mass flow controller (MFC) 304. Conduits may extend between showerheads 330a-330e and MFC 304 as well as between the reagent sources 340 and MFC 304. Each of the showerheads 330a-330e is individually in fluid communication and coupled with a particular reagent source 340. Each reagent source 340 may contain one source of a chemical reagent or multiple sources of chemical reagents. Wafers 320 may move along track 310 and be positioned under an individual showerhead 330 while the plurality of showerheads 330a-330e remains stationary.

In some examples, vapor deposition systems 100, 200, or 300 may be utilized to deposit or otherwise form epitaxial materials, such that the sacrificial layer (e.g., aluminum arsenide or alloy thereof) may have a thickness of about 20 nm or less, such as within a range from about 1 nm to about 10 nm, or from about 4 nm to about 6 nm.

The epitaxial film may have a thickness within a range from about 500 nm to about 3,000 nm, or from about 1,000 nm to about 2,000 nm, or from about 1,200 nm to about 1,800 nm. In some examples, the epitaxial film may contain a gallium arsenide buffer layer having a thickness within a range from about 100 nm to about 500 nm, an aluminum gallium arsenide passivation layer having a thickness within a range from about 10 nm to about 50 nm, a gallium arsenide active layer having a thickness within a range from about 500 nm to about 2,000 nm, and optionally, another aluminum gallium arsenide passivation layer having a thickness within a range from about 10 nm to about 50 nm. In a specific example, the gallium arsenide buffer layer may have a thickness of about 300 nm, the aluminum gallium arsenide passivation layers may have a thickness of about 30 nm, the gallium arsenide active layer may have a thickness of about 1,000 nm, and the optional, second aluminum gallium arsenide passivation layers may have a thickness of about 30 nm.

In other examples, each layer of the epitaxial stack has a solar or photovoltaic cell structure containing multiple layers. In one example, the solar or photovoltaic cell structure contains a material such as gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

Figure 4A:
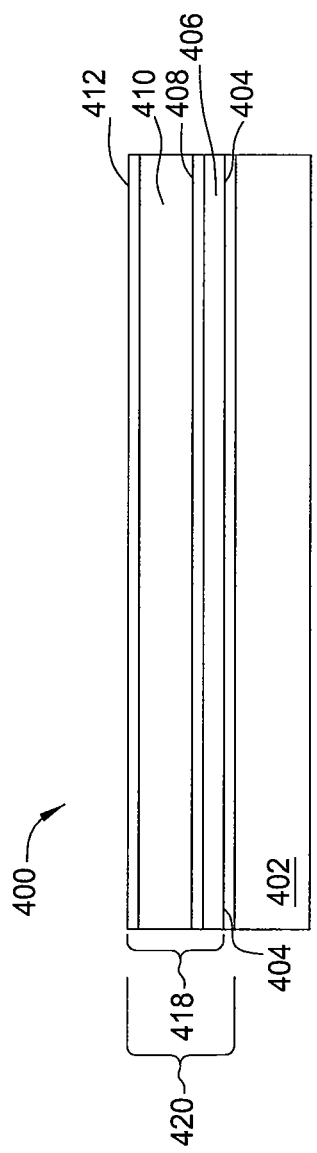
FIG. 4A depicts an ELO thin film stack disposed on a wafer according to embodiments described herein.
Figure 4B:
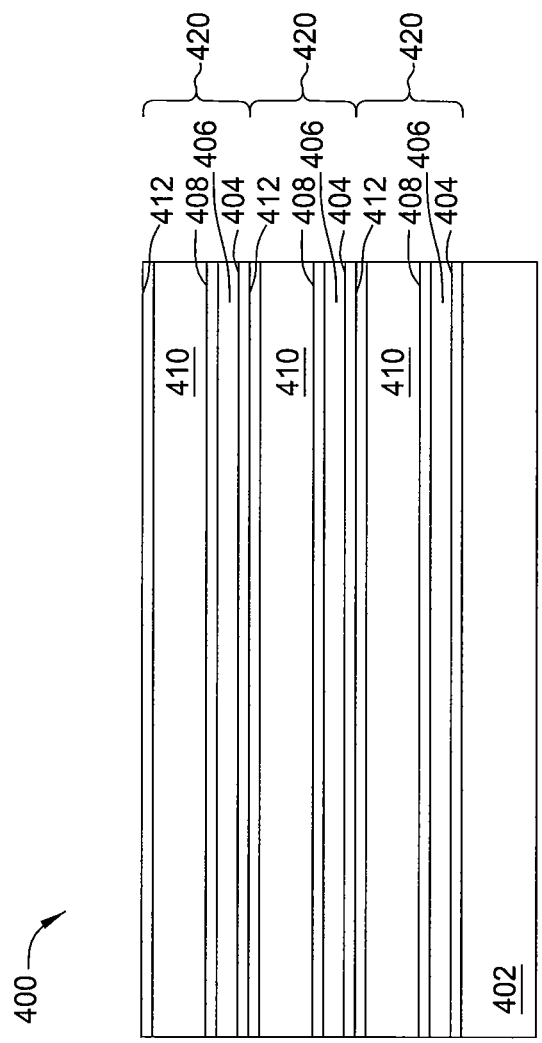
FIG. 4B depicts a plurality of ELO thin film stacks disposed on a wafer according to embodiments described herein.

FIG. 4A depicts an ELO thin film stack, such as epitaxial stack 420 disposed on wafer 402, according to embodiments described herein. In one embodiment, substrate 400 contains at least one epitaxial stack 420, which includes epitaxial film 418 disposed on sacrificial layer 404 disposed on wafer 402. FIG. 4B illustrates substrate 400 containing a plurality of epitaxial stacks 420, sequentially disposed on or over each other and on wafer 402, as described in another embodiment. The plurality of epitaxial stacks 420 may be sequentially formed or deposited on each other by repeating cycles of sequentially deposited sacrificial layer 404 and epitaxial film 418. In some embodiments, vapor deposition systems 100, 200, and/or 300, as described herein, may be used to form epitaxial stacks 420 of substrate 400.

Epitaxial film 418 may contain at least gallium arsenide active layer 410 of gallium arsenide, but may contain a plurality of other layers, including buffer and passivation layers. As depicted in FIGS. 4A-4B, epitaxial film 418 disposed on sacrificial layer 404, and epitaxial film 418 contains buffer layer 406 disposed on sacrificial layer 404, passivation layer 408 disposed on buffer layer 406, gallium arsenide active layer 410 disposed on passivation layer 408, and passivation layer 412 disposed on gallium arsenide active layer 410, as described in embodiments herein.

While FIG. 4B depicts substrate 400 containing three epitaxial stacks 420, substrate 400 may have a plurality of epitaxial stacks 420, such as at least two epitaxial stacks 420. In some examples, substrate 400 may contain three, four, five, six, ten, twelve, twenty, thirty, fifty, one hundred, or more epitaxial stacks 420. In various embodiments, the ELO process includes removing sacrificial layers 404 during an etching process, while peeling epitaxial film 418 from wafer 402 or another epitaxial film 418 and forming an etch crevice therebetween until epitaxial film 418 is removed from substrate 400. In one embodiment, each epitaxial film 418 may be removed from substrate 400 one film at a time, such as removing epitaxial films 418 from the upper most stack epitaxial stack 420 to the lowest epitaxial stack 420 disposed on wafer 402. Alternatively, all of the epitaxial films 418 may be simultaneously or substantially simultaneously removed from substrate 400.

In one embodiment, a thin film stack on substrate 400 is provided which includes a plurality of epitaxial stacks 420 disposed on wafer 402, wherein each epitaxial stack 420 contains an epitaxial film 418 deposited over sacrificial layer 404, as depicted in FIGS. 4A-4B. In many examples, wafer 402 contains gallium arsenide or a gallium arsenide alloy. In another embodiment, a thin film stack on substrate 400 contains a plurality of epitaxial stacks 420 disposed over each other and on wafer 402, wherein each epitaxial stack 420 contains an epitaxial film 418 deposited over sacrificial layer 404.

In another embodiment, epitaxial stack 420 on substrate 400 is provided which includes a first sacrificial layer 404 disposed on wafer 402, a first epitaxial film 418 disposed over the first sacrificial layer 404, a second sacrificial layer 404 disposed over the first epitaxial film 418, and a second epitaxial film 418 disposed over the second sacrificial layer 404. In another embodiment, the epitaxial stack further contains a third sacrificial layer 404 disposed over the second epitaxial film 418, and a third epitaxial film 418 disposed over the third sacrificial layer 404.

FIG. 4B depicts substrate 400 containing three epitaxial stacks 420 stacked over or on each other, as described by one example herein. The examples provide the plurality of epitaxial stacks 420 may contain 2 or more epitaxial stacks 420, such as 3, 4, 5, 6, 10, 12, 20, 30, 50, 100, or more epitaxial stacks 420.

Each epitaxial film 418 may have the same composition or have different compositions. In some examples, each epitaxial film 418 may independently contain gallium arsenide, aluminum gallium arsenide, indium gallium phosphide, alloys thereof, derivatives thereof, or combinations thereof. Also, each epitaxial film 418 may have multiple layers. In one example, each epitaxial film 418 independently has a layer containing gallium arsenide and another layer containing aluminum gallium arsenide. Each epitaxial film 418 may have a thickness within a range from about 500 nm to about 3,000 nm, or from about 1,000 nm to about 2,000 nm, or from about 1,200 nm to about 1,800 nm, for example, about 1,500 nm.

In other examples, each epitaxial film 418 may independently contain buffer layer 406, passivation layer 408, and gallium arsenide active layer 410. In some examples, each epitaxial film 418 further contains a second passivation layer 412. In one example, each epitaxial film 418 may independently have buffer layer 406 containing gallium arsenide, passivation layers 408 and 412 containing aluminum gallium arsenide, and gallium arsenide active layer 410. The gallium arsenide buffer layer may have a thickness within a range from about 100 nm to about 400 nm, each of the aluminum gallium arsenide passivation layers 408 and 412 may have a thickness within a range from about 10 nm to about 50 nm, and the gallium arsenide active layer 410 may have a thickness within a range from about 400 nm to about 2,000 nm. In other examples, the gallium arsenide buffer layer 406 may have a thickness of about 300 nm, each of the aluminum gallium arsenide passivation layers 408 and 412 may have a thickness of about 30 nm, and the gallium arsenide active layer 410 may have a thickness of about 1,000 nm.

In other examples, each epitaxial film 418 has a solar or photovoltaic cell structure containing multiple layers. In one example, the solar or photovoltaic cell structure contains a material such as gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

In another embodiment, each sacrificial layer 404 may have the same composition or have different compositions. Each of sacrificial layers 404 independently contain a selective etch material which is readily etched by an etchant (e.g., HF) that does not etch or substantially etch the materials of epitaxial films 418. Exemplary selective etch materials contained within sacrificial layers 404 include aluminum arsenide, alloys thereof, derivatives thereof, or combinations thereof. In some examples, each sacrificial layer 404 may independently contain an aluminum arsenide layer having a thickness of about 20 nm or less, such as within a range from about 1 nm to about 10 nm, preferably, from about 4 nm to about 6 nm.

Wafer 402 may contain or be formed of a variety of materials, such as Group III/IV materials, and may be doped with other elements. In many embodiments, a substrate or wafer 402 contains or is made from gallium arsenide, gallium arsenide alloys, n-doped gallium arsenide, p-doped gallium arsenide, or derivatives thereof.

In another embodiment, a method for forming thin film stacks of various epitaxial materials on substrate 400 is provided which includes depositing a plurality of epitaxial stacks 420 on wafer 402, wherein each epitaxial stack 420 contains epitaxial film 418 deposited over sacrificial layer 404. The method further provides etching sacrificial layers 404 while removing the epitaxial films 418 from substrate 400 during at least one ELO process.

In some examples, the method provides that the first and second epitaxial films 418 are simultaneously separated from substrate 400 during the ELO etching process. In other examples, the etching away the first sacrificial layer 404 while removing the first epitaxial film 418 is subsequent to etching away the second sacrificial layer 404 while removing the second epitaxial film 418 during the ELO etching process.

In other embodiments, the method includes depositing a first epitaxial stack 420 on wafer 402, wherein the first epitaxial stack 420 contains a first sacrificial layer 404 deposited on wafer 402 and a first epitaxial film 418 deposited over the first sacrificial layer 404, and depositing additional epitaxial stacks 420 over the first epitaxial stack 420, wherein each additional epitaxial stack 420 contains a layer of epitaxial film 418 deposited over sacrificial layer 404 and each sacrificial layer 404 is deposited on the layer of epitaxial film 418 of the previously deposited epitaxial stack 420.

In some embodiments, a plurality of substrates 400 may be disposed on a rotatable platen or carousal (as depicted in FIG. 1) or on a rotatable drum (as depicted in FIG. 2) within a processing chamber while multiple sacrificial layers 404 and epitaxial films 418 are deposited on each of the substrates—forming a plurality of epitaxial stacks 420. In one example, substrate 400 may be positioned under a first showerhead to deposit sacrificial layer 404 and substrate 400 is subsequently rotated and positioned under a second showerhead to deposit epitaxial film 418 within the processing chamber. Simultaneously, each of the substrates 400 is positioned under an individual showerhead to deposit an under layer (e.g., sacrificial layer 404) and each of the substrates 400 is subsequently rotated and positioned under another showerhead to deposit an upper layer (e.g., epitaxial film 418) over or on to the under layer. The multiple layers within epitaxial film 418 may be deposited from different regions of the processing chamber or from different showerheads within the processing chamber (as depicted in FIG. 3), as described in another embodiment herein.

In some embodiments, substrate 400, including sacrificial layers 404, may be exposed to a wet etch solution during an ELO etch step. The wet etch solution may contain hydrofluoric acid, and further contain a surfactant and/or a buffer. In some example, sacrificial layers 404 may be etched during a wet etch process at a rate of about 0.3 mm/hr or greater, preferably, about 1 mm/hr or greater, and more preferably, about 5 mm/hr or greater.

In an alternative embodiment, substrate 400 containing the sacrificial layers 404 may be exposed to an electrochemical etch during an ELO etch step. The electrochemical etch may include a biased process or a galvanic process. In another alternative embodiment, sacrificial layers 404 may be exposed to a vapor phase etch during an ELO etch step. The vapor phase etch includes exposing sacrificial layers 404 to hydrogen fluoride vapor. The ELO process as described herein may contain an etching process or an etching step such as a photochemical etch process, a thermally enhanced etch process, a plasma enhanced etch process, a stress enhanced etch process, derivatives thereof, or combinations thereof.

Figure 5A:
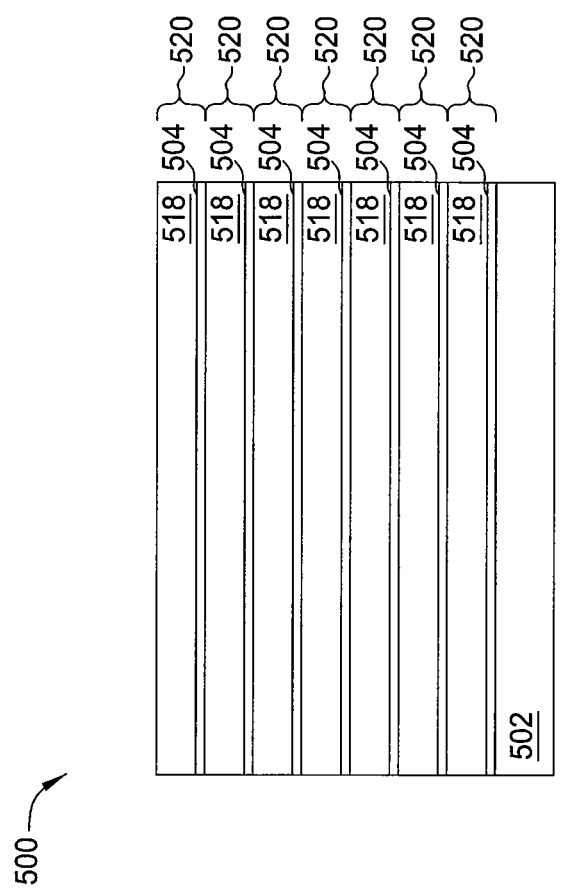
FIG. 5A depicts another plurality of ELO thin film stacks disposed on a wafer according to other embodiments described herein.
Figure 5B:
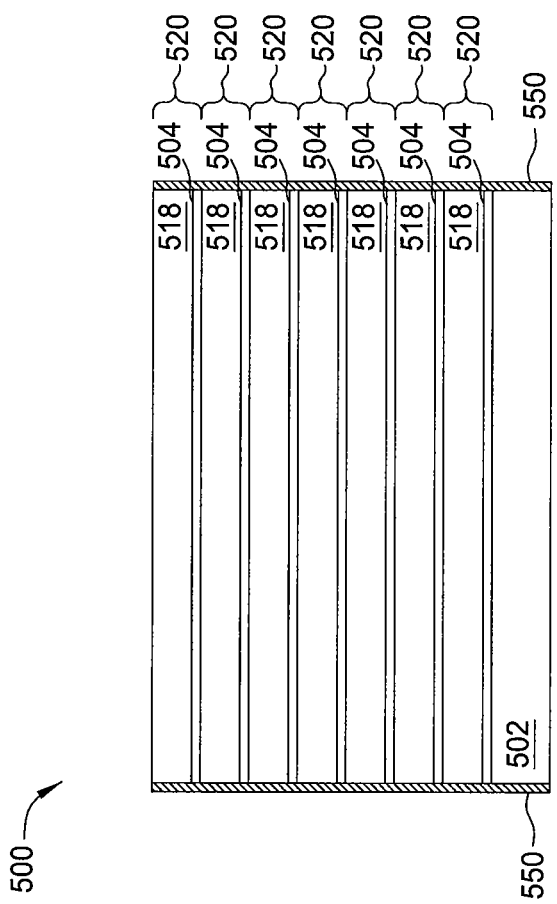
FIG. 5B depicts another plurality of ELO thin film stacks disposed on a wafer according to another embodiment described herein.

In another embodiment described herein, a thin film stack on substrate 500 contains a plurality of epitaxial stacks 520 disposed over each other and on wafer 502, wherein each epitaxial stack 520 contains epitaxial film 518 deposited over sacrificial layer 504, as depicted in FIGS. 5A-5B. In some embodiments, vapor deposition systems 100, 200, and/or 300, as described herein, may be used to form epitaxial stacks 520 of substrate 500.

In an alternative embodiment, as depicted in FIG. 5B, protective layers 550 surrounding the plurality of epitaxial stacks 520 disposed on substrate 500. Protective layer 550 prohibits sacrificial layers 504 from being exposed to an etchant solution or etchant gas during an ELO process. Portions of protective layer 550 may be removed to individually expose each epitaxial stack 520 to the etchant solution or gas. Therefore, each epitaxial film 518 may be individually removed from substrate 500 as each sacrificial layer 504 is individually exposed to an etching process during the ELO process. An individual epitaxial stack 520 or multiple epitaxial stacks 520 may be selectively removed from substrate 500 by removing the portions of protective layer 550 encompassing the desired epitaxial stacks 520. In one example, the portions of protective layer 550 in contact to sacrificial layers 504 are removed to expose sacrificial layer 504 while epitaxial film 518 remains covered by protective layer 550.

Substrate 500 may be formed by sequentially depositing multiple layers of sacrificial layer 504 and epitaxial film 518 on wafer 502, and subsequently, protective layer 550 may be formed or deposited over the plurality of epitaxial stacks 520. Protective layer 550 may be chemically or physically removed from the epitaxial stacks 520. In some examples, protective layer 550 may be exposed to an etching solution or etching gas while being removed from the epitaxial stacks 520. In other examples, protective layer 550 may be rubbed, scrapped, ground, polished, cut, stripped, or otherwise physically removed or detached while exposing the epitaxial stacks 520. Protective layer 550 may contain a layer or multiple layers of barrier materials, such as wax, plastic, polymers, oligomers, rubbers, oxides, nitrides, oxynitrides, or derivatives thereof.

In another embodiment, an epitaxial stack on substrate 500 is provided which includes a first sacrificial layer 504 disposed on wafer 502, a first epitaxial film 518 disposed over the first sacrificial layer 504, a second sacrificial layer 504 disposed over the first epitaxial film 518, and a second epitaxial film 518 disposed over the second sacrificial layer 504. In another embodiment, the epitaxial stack further contains a third sacrificial layer 504 disposed over the second epitaxial film 518, and a third epitaxial film 518 disposed over the third sacrificial layer 504.

FIG. 5 depicts substrate 500 containing seven epitaxial stacks 520 stacked over or on each other, as described by one example herein. The examples provide the plurality of epitaxial stacks 520 may contain 2 or more epitaxial stacks 520, such as 3, 4, 5, 6, 10, 12, 20, 30, 50, 100, or more epitaxial stacks 520.

Each epitaxial film 518 may have the same composition or have different compositions. In some examples, each epitaxial film 518 may independently contain gallium arsenide, aluminum gallium arsenide, indium gallium phosphide, alloys thereof, derivatives thereof, or combinations thereof. Also, each epitaxial film 518 may have multiple layers. In one example, each epitaxial film 518 independently has a layer containing gallium arsenide and another layer containing aluminum gallium arsenide. Each epitaxial film 518 may have a thickness within a range from about 500 nm to about 3,000 nm, or from about 1,000 nm to about 2,000 nm, or from about 1,200 nm to about 1,800 nm, for example, about 1,500 nm.

In other examples, each epitaxial film 518 may independently contain a gallium arsenide buffer layer, an aluminum gallium arsenide passivation layer, and a gallium arsenide active layer. In some examples, each epitaxial film 518 further contains a second aluminum gallium arsenide passivation layer. The gallium arsenide buffer layer may have a thickness within a range from about 100 nm to about 500 nm, the aluminum gallium arsenide passivation layer may have a thickness within a range from about 10 nm to about 50 nm, and the gallium arsenide active layer may have a thickness within a range from about 500 nm to about 2,000 nm. In other examples, the gallium arsenide buffer layer may have a thickness of about 300 nm, the aluminum gallium arsenide passivation layer may have a thickness of about 30 nm, and the gallium arsenide active layer may have a thickness of about 1,000 nm.

In other examples, each epitaxial film 518 has a solar or photovoltaic cell structure containing multiple layers. In one example, the solar or photovoltaic cell structure contains a material such as gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

In another embodiment, each sacrificial layer 504 may have the same composition or have different compositions. Each of sacrificial layers 504 independently contain a selective etch material which is readily etched by an etchant (e.g., HF) that does not etch or substantially etch the materials of epitaxial films 518. Exemplary selective etch materials contained within sacrificial layers 504 include aluminum arsenide, alloys thereof, derivatives thereof, or combinations thereof. In some examples, each sacrificial layer 504 may independently contain an aluminum arsenide layer having a thickness of about 20 nm or less, such as within a range from about 1 nm to about 10 nm, preferably, from about 4 nm to about 6 nm.

Wafer 502 may contain or be formed of a variety of materials, such as Group III/IV materials, and may be doped with other elements. In many embodiments, a substrate or wafer 502 contains or is made from gallium arsenide, gallium arsenide alloys, n-doped gallium arsenide, p-doped gallium arsenide, or derivatives thereof.

In another embodiment, a method for forming thin film stacks of various epitaxial materials on substrate 500 is provided which includes depositing a plurality of epitaxial stacks 520 on wafer 502, wherein each epitaxial stack 520 contains epitaxial film 518 deposited over sacrificial layer 504. The method further provides etching sacrificial layers 504 while removing epitaxial films 518 from substrate 500 during at least one ELO process.

In some examples, the method provides that the first and second epitaxial films 518 are simultaneously separated from substrate 500 during the ELO etching process. In other examples, the etching away the first sacrificial layer 504 while removing the first epitaxial film 518 is subsequent to etching away the second sacrificial layer 504 while removing the second epitaxial film 518 during the ELO etching process.

In some embodiments, the method includes depositing a first epitaxial stack 520 on wafer 502, wherein the first epitaxial stack 520 contains a first layer of sacrificial layer 504 deposited on wafer 502 and a first epitaxial film 518 deposited over the first sacrificial layer 504, and depositing additional epitaxial stacks 520 over the first epitaxial stack 520, wherein each additional epitaxial stack 520 contains epitaxial film 518 deposited over sacrificial layer 504 and each sacrificial layer 504 is deposited on epitaxial film 518 of the previously deposited epitaxial stack 520.

In some embodiments, a plurality of substrates 500 may be disposed on a rotatable platen or carousal (as depicted in FIG. 1) or on a rotatable drum (as depicted in FIG. 2) within a processing chamber while multiple sacrificial layers 504 and epitaxial films 518 are deposited on each of the substrates—forming a plurality of epitaxial stacks 520. In one example, substrate 500 may be positioned under a first showerhead to deposit sacrificial layer 504 and substrate 500 is subsequently rotated and positioned under a second showerhead to deposit epitaxial film 518 within the processing chamber. Simultaneously, each of the substrates 500 is positioned under an individual showerhead to deposit an under layer (e.g., sacrificial layer 504) and each of the substrates 500 is subsequently rotated and positioned under another showerhead to deposit an upper layer (e.g., epitaxial film 518) over or on to the under layer. The multiple layers within epitaxial film 518 may be deposited from different regions of the processing chamber or from different showerheads within the processing chamber (as depicted in FIG. 3), as described in another embodiment herein.

In some embodiments, sacrificial layers 504 or material may be exposed to a wet etch solution during an ELO etch step. The wet etch solution may contain hydrofluoric acid, and further contain a surfactant and/or a buffer. In some example, sacrificial layers 504 or material may be etched during a wet etch process at a rate of about 0.3 mm/hr or greater, preferably, about 1 mm/hr or greater, and more preferably, about 5 mm/hr or greater.

In an alternative embodiment, substrate 500 containing the sacrificial layers 504 may be exposed to an electrochemical etch during an ELO etch step. The electrochemical etch may include a biased process or a galvanic process. In another alternative embodiment, sacrificial layers 504 may be exposed to a vapor phase etch during an ELO etch step. The vapor phase etch includes exposing sacrificial layers 504 to hydrogen fluoride vapor. The ELO process as described herein may contain an etching process or an etching step such as a photochemical etch process, a thermally enhanced etch process, a plasma enhanced etch process, a stress enhanced etch process, derivatives thereof, or combinations thereof.

While the foregoing is directed to embodiments of the invention, other and further embodiments of the invention may be devised without departing from the basic scope thereof, and the scope thereof is determined by the claims that follow.

The invention claimed is:

1. A method for forming thin film stacks on a substrate surface, comprising:
   depositing a first sacrificial layer over a substrate, wherein the substrate is positioned under a first showerhead for deposition of the first sacrificial layer;
   depositing a first epitaxial film over the first sacrificial layer, wherein the substrate is positioned under a second showerhead for deposition of the first epitaxial film;
   depositing a second sacrificial layer over the first epitaxial film;
   depositing a second epitaxial film over the second sacrificial layer;
   forming additional epitaxial stacks on the substrate and over the second epitaxial stack, wherein each additional epitaxial stack comprises an epitaxial film deposited over a sacrificial layer and each sacrificial layer is deposited on the epitaxial film of the previously deposited epitaxial stack; and
   separating the first and second epitaxial films from the substrate during an epitaxial lift off process by:
      etching away the second sacrificial layer while removing the second epitaxial film; and
      etching away the first sacrificial layer while removing the first epitaxial film.

2. The method of claim 1, wherein the first and second epitaxial films are simultaneously separated from the substrate.

3. The method of claim 1, wherein etching away the first sacrificial layer while removing the first epitaxial film is subsequent to etching away the second sacrificial layer while removing the second epitaxial film.

4. The method of claim 1, further comprising:
   depositing a third sacrificial layer over the second epitaxial film; and
   depositing a third epitaxial film over the third sacrificial layer prior to the epitaxial lift off process.

5. The method of claim 1, wherein the substrate comprises gallium arsenide, alloys thereof, dopants thereof, or derivatives thereof.

6. The method of claim 1, wherein the substrate is disposed on a rotatable platen or a rotatable drum within a processing chamber.

7. The method of claim 6, wherein a plurality of substrates is disposed on the rotatable platen or the rotatable drum within the processing chamber, and the sacrificial layers and the epitaxial films are deposited on each of the substrates.

8. The method of claim 6, wherein the substrate is positioned under a first showerhead to deposit the first sacrificial layer and the substrate is subsequently rotated and positioned under a second showerhead to deposit the first epitaxial film within the processing chamber.

9. The method of claim 6, wherein each epitaxial film comprises multiple layers, and each layer is deposited from different regions or from different showerheads within the processing chamber.

10. The method of claim 6, wherein each epitaxial film independently comprises a gallium arsenide buffer layer, a first aluminum gallium arsenide passivation layer, a gallium arsenide active layer, and a second aluminum gallium arsenide passivation layer.

11. The method of claim 1, wherein each of the first and second epitaxial films independently comprises a layer comprising gallium arsenide and another layer comprising aluminum gallium arsenide.

12. The method of claim 1, wherein each of the first and second epitaxial films independently comprises a material selected from the group consisting of gallium arsenide, aluminum gallium arsenide, indium gallium phosphide, alloys thereof, derivatives thereof, and combinations thereof.

13. The method of claim 1, wherein each of the first and second sacrificial layers independently comprises a material selected from the group consisting of aluminum arsenide, alloys thereof, derivatives thereof, and combinations thereof.

14. The method of claim 13, wherein each of the first and second sacrificial layers independently has a thickness of about 20 nm or less.

15. The method of claim 14, wherein the thickness is within a range from about 1 nm to about 10 nm.

16. The method of claim 1, wherein the first and second sacrificial layers are exposed to a wet etch solution during the epitaxial lift off process.

17. The method of claim 16, wherein the wet etch solution comprises hydrofluoric acid, a surfactant, and a buffer.

18. The method of claim 16, wherein the first and second sacrificial layers are etched at a rate of about 0.3 mm/hr or greater.

19. The method of claim 18, wherein the rate is about 1 mm/hr or greater.

20. The method of claim 19, wherein the rate is about 5 mm/hr or greater.

21. A method for forming epitaxial film stacks on a substrate surface, comprising:
   forming a first sacrificial layer on a substrate within a first deposition region of a processing chamber;

forming a first epitaxial film over the first sacrificial layer within a second deposition region of the processing chamber;

forming a second sacrificial layer over the first epitaxial film within the first deposition region of the processing chamber;

forming a second epitaxial film over the second sacrificial layer within the second deposition region of the processing chamber;

forming additional epitaxial stacks on the substrate and over the second epitaxial stack, wherein each additional epitaxial stack comprises an epitaxial film deposited over a sacrificial layer and each sacrificial layer is deposited on the epitaxial film of the previously deposited epitaxial stack; and separating the first and second epitaxial films from the substrate during an epitaxial lift off process by:
    etching away the second sacrificial layer while removing the second epitaxial film; and
    etching away the first sacrificial layer while removing the first epitaxial film.

22. The method of claim 21, wherein the first and second epitaxial films are simultaneously separated from the substrate.

23. The method of claim 21, wherein etching away the first sacrificial layer while removing the first epitaxial film is subsequent to etching away the second sacrificial layer while removing the second epitaxial film.

24. The method of claim 21, further comprising:
    forming a third sacrificial layer over the second epitaxial film within the first deposition region of the processing chamber; and
    forming a third epitaxial film over the third sacrificial layer within the second deposition region of the processing chamber prior to the epitaxial lift off process.

25. The method of claim 21, wherein each of the first and second epitaxial films independently comprises a layer comprising gallium arsenide and another layer comprising aluminum gallium arsenide.

26. The method of claim 21, wherein each of the first and second epitaxial films independently comprises a gallium arsenide buffer layer, a first aluminum gallium arsenide passivation layer, a gallium arsenide active layer, and a second aluminum gallium arsenide passivation layer.

27. The method of claim 21, wherein each of the first and second epitaxial films comprises a photovoltaic cell structure of multiple layers, and each of the photovoltaic cell structures independently comprises at least two materials selected from the group consisting of gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, and combinations thereof.

28. The method of claim 21, wherein each of the first and second sacrificial layers independently comprises a material selected from the group consisting of aluminum arsenide, alloys thereof, derivatives thereof, and combinations thereof.

29. The method of claim 26, wherein each of the first and second sacrificial layers independently has a thickness of about 20 nm or less.

30. The method of claim 21, wherein the substrate is disposed on a rotatable platen or a rotatable drum within the processing chamber.

31. The method of claim 30, wherein a plurality of substrates is disposed on the rotatable platen or the rotatable drum within the processing chamber, and the sacrificial layers and the epitaxial films are deposited on each of the substrates.

32. The method of claim 30, wherein the substrate is positioned under a first showerhead to deposit the first sacrificial layer and the substrate is subsequently rotated and positioned under a second showerhead to deposit the first epitaxial film within the processing chamber.

33. The method of claim 30, wherein each epitaxial film comprises multiple layers, and each layer is deposited from different regions or from different showerheads within the processing chamber.

34. A method for forming epitaxial film stacks on a substrate surface within a processing chamber, comprising:
    forming a first epitaxial stack on a substrate by:
        depositing a first sacrificial layer over the substrate; and
        depositing a first epitaxial film over the first sacrificial layer;
    forming additional epitaxial stacks on the substrate and over the first epitaxial stack, wherein each additional epitaxial stack comprises an epitaxial film deposited over a sacrificial layer and each sacrificial layer is deposited on the epitaxial film of the previously deposited epitaxial stack; and
    etching the sacrificial layers while removing the epitaxial films from the substrate during an epitaxial lift off process.

35. The method of claim 34, wherein the substrate is disposed on a rotatable platen or a rotatable drum within the processing chamber.

36. The method of claim 35, wherein a plurality of substrates is disposed on the rotatable platen or the rotatable drum within the processing chamber, and the sacrificial layers and the epitaxial films are deposited on each of the substrates.

37. The method of claim 35, wherein the substrate is positioned under a first showerhead to deposit the sacrificial layers and the substrate is subsequently rotated and positioned under a second showerhead to deposit the epitaxial films within the processing chamber.

38. The method of claim 35, wherein each epitaxial film comprises multiple layers, and each layer is deposited from different regions or from different showerheads within the processing chamber.

39. The method claim 35, wherein each epitaxial film independently comprises a material selected from the group consisting of gallium arsenide, aluminum gallium arsenide, indium gallium phosphide, alloys thereof, derivatives thereof, and combinations thereof.

40. The method of claim 35, wherein each epitaxial film independently comprises a layer comprising gallium arsenide and another layer comprising aluminum gallium arsenide.

41. The method of claim 35, wherein each epitaxial film independently comprises a gallium arsenide buffer layer, an aluminum gallium arsenide passivation layer, and a gallium arsenide active layer.

42. The method of claim 35, wherein each epitaxial film comprises a photovoltaic cell structure of multiple layers, and each of the photovoltaic cell structure comprises at least two materials selected from the group consisting of gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, and combinations thereof.

43. The method of claim 35, wherein 3 or more epitaxial stacks are contained within the plurality of epitaxial stacks.

44. The method of claim 41, wherein 6 or more epitaxial stacks are contained within the plurality of epitaxial stacks.

45. The method of claim 42, wherein the plurality of epitaxial stacks contains at least about 10 epitaxial stacks and up to about 100 epitaxial stacks.

46. The method of claim 35, wherein each of the sacrificial layers independently comprises a material selected from the group consisting of aluminum arsenide, alloys thereof, derivatives thereof, and combinations thereof.

47. The method of claim 35, wherein the substrate comprises gallium arsenide, alloys thereof, dopants thereof, or derivatives thereof.

* * * * *